United States Patent [19]

Keller et al.

[11] Patent Number: 4,788,502

[45] Date of Patent: Nov. 29, 1988

[54] APPARATUS FOR COMPENSATING FOR TIME-VIBRANT FIELD INTERFERENCE IN MAGNETIC FIELDS

[76] Inventors: Anton W. Keller, Odenwaldstrasse 14, D-7512 Rheinstetten, Fed. Rep. of Germany; Werner H. Tschopp, Eggenbergstrasse 11, CH-8127 Forch; Anton Kuster, Müllerwis 25, CH-8606 Greifensee, both of Switzerland

[21] Appl. No.: 85,374

[22] Filed: Aug. 14, 1987

[30] Foreign Application Priority Data

Aug. 20, 1986 [DE] Fed. Rep. of Germany ....... 3628161

[51] Int. Cl.[4] .................................... G01R 33/20
[52] U.S. Cl. .................................... 324/318; 335/299
[58] Field of Search ............. 324/300, 307, 309, 312, 324/313, 314, 318, 319, 320, 322; 128/653; 335/299

[56] References Cited

U.S. PATENT DOCUMENTS

| | | | |
|---|---|---|---|
| 4,284,950 | 8/1981 | Burl | 324/320 |
| 4,652,826 | 3/1987 | Yamamoto | 324/320 |
| 4,670,716 | 6/1987 | Kunz | 324/320 |
| 4,680,551 | 7/1987 | O'Donnell | 324/320 |
| 4,689,591 | 8/1987 | McDougall | 324/319 |

Primary Examiner—Michael J. Tokar
Attorney, Agent, or Firm—Poms, Smith, Lande & Rose

[57] ABSTRACT

An apparatus is employed to compensate for time-variant field interference in magnetic fields of electromagnets with high field homogeneity, in particular in specimen areas of superconductive electromagnets for measurements of magnetic resonance. The magnetic field that permeates a specimen area of the electromagnet is identified by means of at least one induction coil, a voltage induced in the induction coil is supplied to a control stage, and a compensating current that flows through a compensating coil that surrounds the specimen area is set by means of an output signal from the control stage. In order to be able to compensate for remote interference emanating from far outside the magnet, at least one compensating coil and at least two induction coils, or vice versa, are disposed. Disposed in the control stage is either a voltage adder, to which the induced currents of the at least two induction coils can be supplied and differently weighted, or a current divider, which supplies differently weighted compensating currents to at least two compensating coils. The induction voltages or compensating currents can be weighted as a function of frequency.

16 Claims, 4 Drawing Sheets

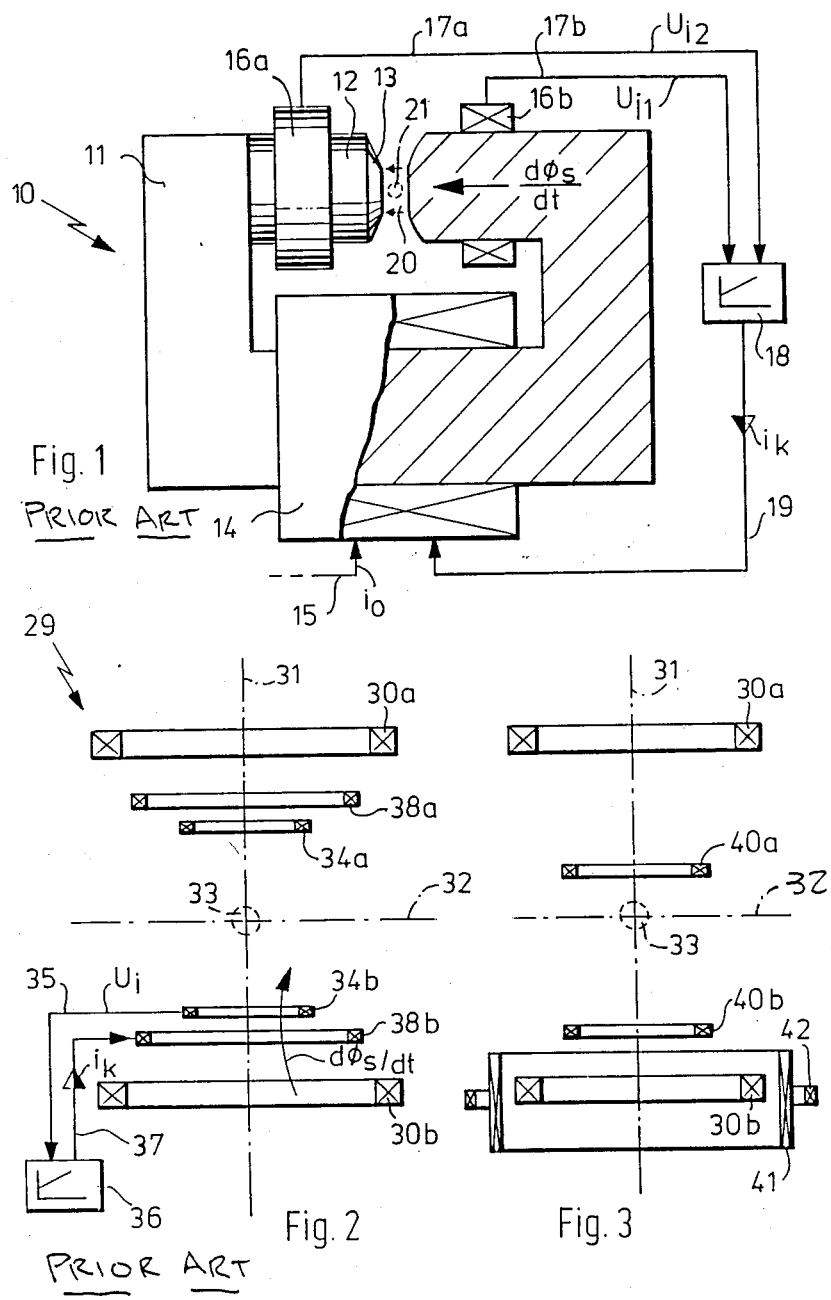

$i_{k1} = x \, i_k$
$i_{k2} = (1-x) i_k$
$x = f(v)$ $x U_{i1} + (1-x) U_{i2} = 0$
$x = f(v)$

APPARATUS FOR COMPENSATING FOR TIME-VIBRANT FIELD INTERFERENCE IN MAGNETIC FIELDS

The present invention relates to an apparatus for compensating for time-variant field interference in magnetic fields of electromagnets with high field homogeneity, in particular in specimen areas of superconductive electromagnets for measurements of magnetic resonance, in which the magnetic field that permeates a specimen area of the electromagnet is identified by means of at least one induction coil, a voltage induced in the induction coil is supplied to a control stage, and a compensating current that flows through a compensating coil that surrounds the specimen area is set by means of an output signal from the control stage.

An apparatus of this type is known from German Disclosed patent application No. 3,308,157.

For various measurement purposes, it is necessary to produce a magnetic field of high field strength and high field homogeneity. Typical applications include measurements of the magnetic resonance, i.e. the nuclear resonance or the electron spin resonance; however homogenous magnetic fields are also required for mass spectrometry, for example, in particular for ICR mass spectrometry.

Numerous apparatuses for compensating the magnetic field that is produced by an electromagnet, be it an iron-core magnet, an air-core magnet, a superconductive magnet system or a combination of such magnets, with respect to the interference that occurs in actual practice are known from nuclear resonance technology, in particular.

In addition to various techniques for compensating for homogeneity interference, which are not of interest in the present context, it is also known practice to provide compensation for interference which manifests itself in a time-variant manner in the absolute magnitude of the magnetic field, which is typically expressed as magnetic induction B.

A so-called "field lock" is customarily employed in magnetic resonance technology to compensate for very low-frequency field interference of this nature, so-called drifts. A reference sample having a pronounced, narrow nuclear resonance line, a so-called "standard", is employed for this purpose, whereby the gyromagnetic ratio of this resonance line, i.e. the ratio of the resonance frequency to the magnetic field strength, is known precisely. The nuclear resonance of this reference line is persistently excited and, with a permanently set measurement frequency, for example, it is then possible to identify whether a correction is necessary as a result of magneti field drift.

To compensate for somewhat higher-frequency interference in the magnetic field strength, it is known practice from the field of iron-core magnets to perform so-called "flux stabilization", as is described, for example, in GERMAN JOURNAL Z. Instr. 67, pages 293 to 300 (1959). In this known arrangement, induction coils, so-called "pickup coils" are employed concentrically to pole shoes of an iron-core magnet; low-frequency fluctuations of the magnetic field strength can be identified with these induction coils, as field fluctuations of this type induce an induction voltage in these coils. The induced voltage is supplied to a direct-current amplifier, which, in turn, produces a current that is supplied to a field coil of the electromagnet. In this manner, it is possible to compensate for field interference in a range of approximately 0.1 to 1 Hz.

An apparatus which is employed in a superconductive magnet system incorporating a mechanical refrigerator, attached directly adjacent thereto, is known from German Disclosed patent application No. 3,308,157, which was cited at the outset. A superconductive magnet system consists of a solenoid coil wound of superconductive wire and arranged in the interior of a cryostat, in which it is located within a liquid-helium bath. Located about the innermost vessel, containing liquid helium, as a general rule, are further cold shields and vessels containing liquid nitrogen in order to be able to maintain the extremely low temperatures that are required for operation of the superconductive coil with the lowest possible losses. In the known superconductive magnet system, a mechanical refrigerator, i.e. a motor-driven chiller, attached directly adjacent thereto, is employed, from which two concentric cooling arms extend into the interior of the cryostat and maintain the cooling shields and liquid-nitrogen-filled vessels at a low temperature.

In the known apparatus, measures have been taken to compensate for the interference that is caused by the mechanical drive of the refrigerator. Since metallic components whose susceptibility is not negligible are in motion in the mechanical drive, magnetic interference signals are produced in the specimen area, which is located in the innermost portion of the cryostat; even though they are of very low amplitude, they can nevertheless have an interfering effect in the case of high resolution magnetic resonance measurements.

The known apparatus proposes that induction coils be disposed either directly on the refrigerator or in the specimen area, i.e. in the interior of the cryostat, which identify the interference signals there that are produced by the refrigerator by means of the voltages that are induced in the coils and which derive therefrom a compensating current for a compensating coil.

The above-described apparatus is sufficient for the above-described application of compensating for interference that is produced by a mechanical device arranged in the direct proximity of the superconductive magnetic coil, as the nature and effect of the above-described interference that is produced while the refrigerator is in operation is more or less predictable; consequently, the desired compensation can be achieved with relatively simple means.

It has been found, however, that as the measurement accuracy of magnet systems, in particular of the type that are employed in high resolution nuclear resonance spectroscopy, has increased, there has also been an increase in sensitivity toward external interference, in particular in the case of superconductive magnet systems which, without an iron core or jacket, are relatively openly subjected to that interference which irradiates the magnet system from the outside in an uncontrolled manner. Heavy, moving magnetic components, in particular, such as elevators, streetcars, etc., have proven to have an especially great interference effect. Consequently, for example, it has been found that interference fields that are produced by a freight elevator located at a distance of 50 m or more from the spectrometer room have manifested themselves in a nuclear resonance spectrometer incorporating a superconductive magnet system that is installed in a customary research institute, as has interference that is produced by streetcars running on the street at an even greater distance from the spectrometer.

Simple apparatuses of the type that are described in German Disclosed patent application No. 3,308,157 are not sufficient for compensating for interference whose occurrence can not be predicted on the basis of either time, amplitude, direction or phase if for no other reason than because an induction coil that is arranged in or about the specimen area is only able to identify the integral flux of the interference field and supply a current to a compensating coil as a function thereof, without knowing either the actual nature of the magnetic field interference at the location of the specimen in the specimen area or the precise effect that will be exerted by the compensating coil in the specimen area. Consequently, it is quite realistic that, while the interference will macroscopically appear to have been compensated by an apparatus of the type cited at the outset, it will be seen microscopically that field interference will still remain at the location of the specimen, itself, and that the area compensated by the induction coil or by the area filled by the induction coil will only be compensated integrally. The interference field that remains at the location of the specimen will usually display a frequency-dependent amplitude and phase response.

It is therefore, on the contrary, the object of the present invention to further develop an apparatus of the type described at the outset in such a manner as to permit significantly more precise compensation to be made for time-variant field interference, while simultaneously taking into consideration the real conditions that exist as a result of the presence of measurement instrumentation, in particular the magnet coil, itself.

According to the present invention, this object is solved in that at least one induction coil and at least two compensating coils are disposed, and in that a current divider for dividing the compensating current that is supplied to the two compensating coils is disposed in the control stage.

In the case of complete flux compensation, the voltage through the induction coil is zero, i.e. there is no integral flux change through the induction coil. As opposed to the prior art, however, this is achieved in that compensating currents flow through at least two compensating coils, whose ratio is also adjustable. By varying this additional parameter, it is now possible to eliminate not only the integral flux change in the balanced state, but the magnetic field change at the location of the specimen, as well.

According to the present invention, the object upon which the present invention is based is further solved in that at least one compensating coil and at least two induction coils are disposed, and in that a voltage adder, to which the induced currents of the at least two induction coils can be supplied and differently weighted, is disposed in the control stage.

As a result of this measure, as well, a further free parameter is created, which is set in such a manner as to provide exact compensation for the change in the magnetic field at the location of the specimen, in addition to integral flux compensation.

In principle, it would also be conceivable for a total of only two coils of suitable diameter to suffice, with their positions being mechanically optimized, i.e. however always completely for the frequency of the interference signal only. The solution that is proposed in the present invention, incorporating a total of at least three coils, provides the advantage that optimation need no longer be performed mechanically, and can thus be performed in a significantly simpler and more variable manner. At the same time, it also provides the opportunity of being able to eliminate interference within a broad frequency range by dividing the currents or voltages as a function of frequency, e.g. through installation of at least one attenuator or amplifier having an adjustable frequency response, i.e. adjustable amplitude and phase.

The object upon which the present invention is based is solved completely, because the apparatus according to the present invention differs from prior-art apparatuses with respect to one significant point.

According to the present invention, at least three coils are employed, i.e. at least one induction coil and two differently weighted compensating coils or two differently weighted induction coils and one compensating coil.

The present invention, with the above cited two variants, thus offers the significant advantage of being able to compensate for externally permeating field interference in a manner that has thus far not been able to be accomplished this well, even if a high degree of effort is employed.

Practical tests have shown that interference suppression on the order of powers of ten is possible in the case of field interference of this type, which typically occurs within a frequency range of between 0.05 and 5 Hz and with a strength of several 10 mG. This is a significant advantage, particularly in the above-cited frequency range, as it has been found that superconductive magnet systems sometimes display inherent resonances in the frequency range of approximately 1 Hz, which can lead to significant increases in error, which means that error compensation is especially important and effective in this frequency range, in particular.

All in all, the result of the present invention is that compensation for time-variant field interference, in conjunction with measurements of magnetic nuclear resonance, for example, is possible throughout virtually the entire frequency range. While sufficient compensation can be made for extremely low-frequency field interference, in particular drifts, through the field lock that was described at the outset, the apparatus according to the present invention is effective within the above-cited frequency range, all the way to several Hz. However higher frequency interference can usually remain uncompensated, as it is screened by the magnet and does not interfere with customary nuclear resonance measurements.

In a preferred embodiment of the present invention, the induction coils and the compensating coils are arranged coaxially, one relative to the other.

This measure provides the advantage that dimensioning, positioning and excitation of the coils can be more easily calculated and effected.

In a preferred variant of this practical example, the induction coils and the compensating coils are not only arranged coaxially, one relative to the other, but also relative to field coils of the electromagnet.

This measure provides the advantage that the apparatus according to the present invention compensates primarily for the axial component in the direction of the main axis of the magnet system, which is especially sensitive to external interference.

In further practical examples of the present invention, at least one induction coil can be arranged within or outside a field coil of the electromagnet, and at least one compensating coil can be disposed outside or within the field coil.

This measure provides the advantage that the respectively existing peripheral conditions of the measurement instrumentation can be taken into consideration in this manner.

In an especially preferred practical example of the present invention, incorporating a compensating coil that is arranged outside the field coil, the compensating coil is disposed at an axial distance from the field coil of the electromagnet and has a diameter that is significantly greater than, and preferably at least twice as large as, the diameter of the field coil.

In this practical example, in particular, the electromagnet is a superconductive magnet which is arranged with a vertical axis in a frame above a floor, and the compensating coil is arranged on the floor, beneath the frame.

This measure provides the significant advantage that compensation can be made for remote interference, in particular, of the type that is produced in the above-described manner by heavy, moving magnetic components that are located at a great distance from the magnet system.

The arrangement of the compensating coils of very large diameter outside the magnet system provides the advantage that the compensating field at least approximates a remote field and that compensation for the occurring interference can therefore be made with a similar magnitude, in terms of its character. This is especially applicable if a coaxial induction coil, which identifies the remote interference as such, is disposed directly adjacent to the compensating coil, whereby the third required coil can then be disposed at or in the specimen area in the form of a smaller induction or compensating coil.

In a preferred embodiment of the present invention, the electromagnet is a superconductive magnet of a nuclear resonance spectrometer having a control circuit in which the spectral position of a given line of a reference sample is monitored and a compensating field is produced by means of a coil as a function of a shift of the line, with the coil simultaneously serving as a compensating coil.

This measure provides the advantage that the above-described field lock is also utilized in that the coil of the field lock is simultaneously employed as a compensating coil in the sense of the present invention. This provides the advantage that no additional space is required in the vicinity of the specimen area.

In a preferred embodiment of the present invention, the ratio of the at least two compensating currents or of the at least two weighted induction voltages is a function of frequency. This measure provides the advantage of being able to provide exact compensation for interference for not merely one frequency, but within a broad frequency range.

The above discussed and other objects, features and advantages of the present invention will become more apparent from the following description thereof, when taken in connection with the practical examples shown in the accompanying drawings, in which FIG. 1 shows a schematic circuit diagram of a prior-art flux stabilizer of an iron-core magnet;

FIG. 2 shows a schematic representation of a prior-art flux stabilizer in a superconductive magnet system;

FIG. 3 shows a representation similar to that illustrated in FIG. 2, however modified in accordance with the present invention;

Figure 7:
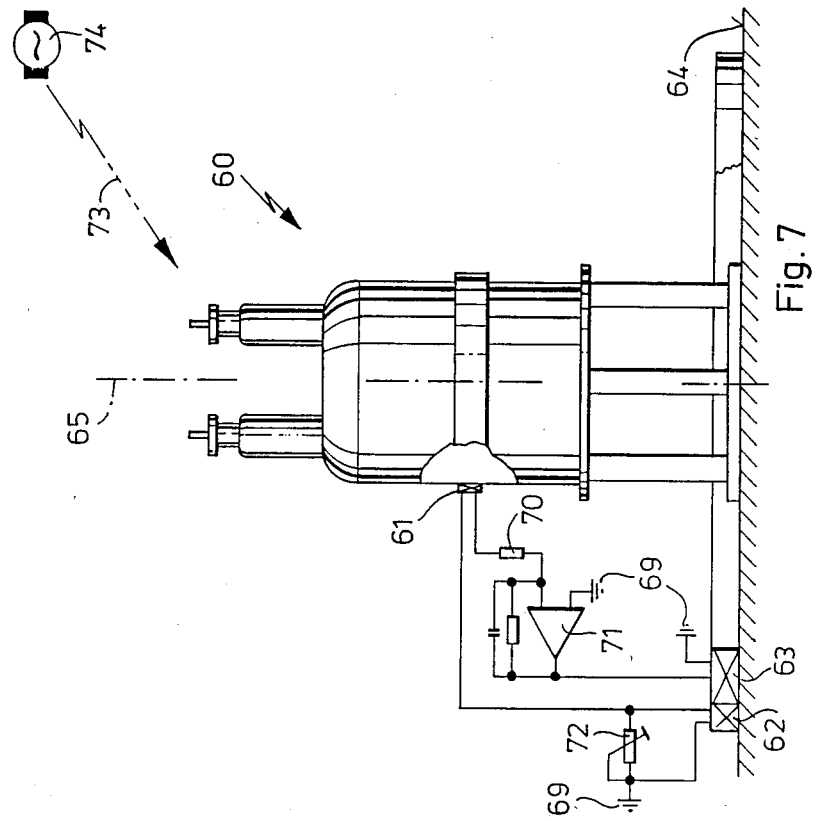
FIG. 7 shows a variant of the system illustrated in FIG. 6.
Figure 8:
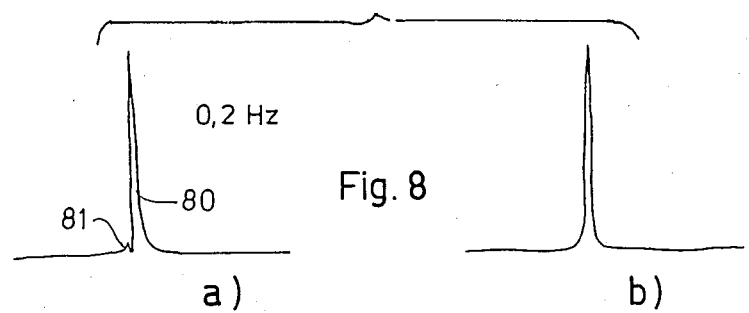
Figure 9:
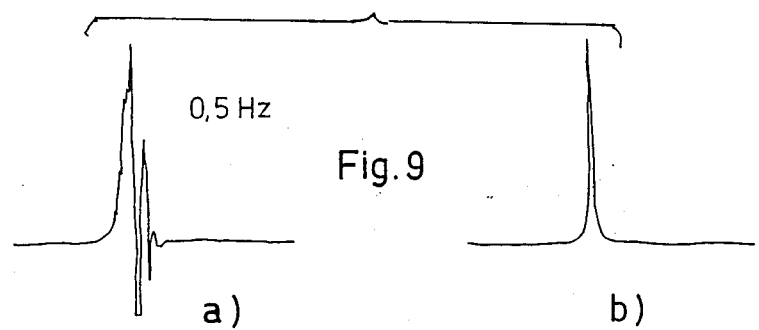
Figure 10:
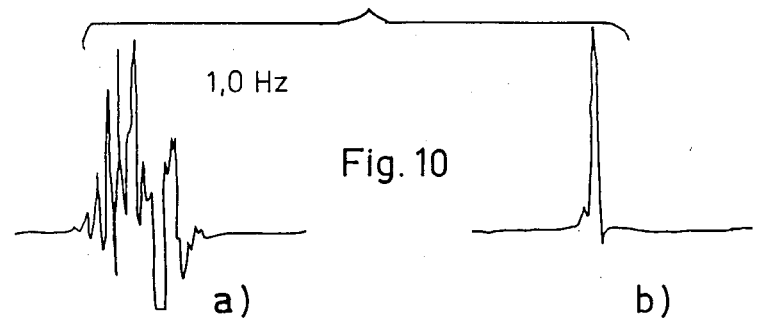

FIGS. 8(a,b), 9(a,b) 10(a,b) and 11(a,b) show nuclear resonance lines that were recorded in the presence of external time-variant field interference of differing frequency according to the prior art and with an apparatus according to the present invention as shown in FIG. 7.

Referring now to the drawings, where like reference numerals designate like parts throughout the several views, FIG. 1 shows a customary iron-core electromagnet 10, having a yoke 11 on which pole shanks 12 are disposed, with pole shoes 13 being disposed at the free ends thereof. An excitation coil 14 is wound about yoke 11 and provided with a supply lead 15 via which an excitation current $i_0$ is supplied to excitation coil 14.

Moreover, induction coils 16a, 16b, which are connected to a gain control amplifier 18 by means of leads 17a and 17b, respectively, are additionally wound about pole shanks 12. Gain control amplifier 18 is connected with excitation coil 14 via a lead 19 or with a further field coil of iron-core electromagnet 10. A measurement air gap 20, within which a specimen area 21 is defined, extends between pole shoes 13.

Should, for any reasons, a time-variant field interference occur in iron-core electromagnet 10 in the form of a flux change $d\phi_{s/dt}$, voltages $U_{i1}$, $U_{i2}$ are induced in induction coils 16a, 16b as a result of the flux change, and are converted into a compensating current $i_k$ in gain control amplifier 18. Compensating current $i_k$ is employed in the above-described manner to compensate for time-variant field interference $d\phi_{s/dt}$.

FIG. 2 shows a corresponding arrangement for an air-core electromagnet 29, which can be designed either as a resistive magnet or as a superconductive magnet. Although the coils that are employed in magnet 29 in FIG. 2 are designed in the form of Helmholtz coils, they can, of course, also be designed as solenoid coils or as combinations of these two types of coils. A pair of air-core coils 30a, 30b produces the constant primary field predominantly in the direction of a longitudinal axis 31, whereby a lateral axis 32 is disposed perpendicular thereto, with a specimen area 33 being located at the point of intersection thereof. A pair of induction coils 34a, 34b is connected with a gain control amplifier 36 via a lead 35, with gain control amplifier 36, in turn, being connected with a pair of compensating coils 38a, 38b via a lead 37.

The theory of operation of the known arrangement according to FIG. 2 corresponds to that of the arrangement shown in FIG. 1. An external time-variant field interference $d\phi_{s/dt}$ flows through both air-core coils 30a, 30b and induction coils 34a, 34b, causing an induction voltage $U_i$ to be induced in the latter. Gain control amplifier 36 forms a compensating current $i_k$ therefrom and feeds it to compensating coils 38a, 38b.

However, as can clearly be seen from FIG. 2, the configuration of coils 34/38, which tends to be selected in a random manner, is only able to identify and compensate integral states. However asymmetrical as well as symmetrical field states are also quite conceivable within the volume that is surrounded by pairs of coils 34/38, which macroscopically suggest complete field interference compensation, even though residual errors are still present precisely in specimen area 33.

According to the prior art, the positioning, dimensioning and excitation of induction and compensating coils 34/38 according to FIG. 2 tends to be performed on a random basis or in accordance with practical aspects. One conceivable improvement is to overcome this tendency toward random arrangement by precisely calculating the dimensioning, positioning and excitation of the induction and compensating coils. However, in systems incorporating superconductive magnet coils, this generally does not lead to the desired success, as the screening influence of the superconductive windings is not taken into consideration. Moreover, this would also involve an extremely great calculation effort.

Consequently, the present invention provides for the additional arrangement of at least a third coil, as will be described in detail below.

Although the result can be a configuration that is similar to FIG. 2, however with an additional third coil, the configuration can also be asymmetrical relative to the point of intersection of axes 31, 32, as shown in the example according to FIG. 3. In this example, an axially displaced pair of coils 40a/40b, an axially displaced solenoid coil 41, as well as an axially displaced toroid coil 42, are disposed instead of the strictly symmetrical arrangement according to FIG. 2. One of each of these three coils 40a/40b, 41 and 42 is an induction coil and one a compensating coil, while the third coil can be either an induction coil or a compensating coil.

According to the present invention, the air-core electromagnet that is illustrated in FIG. 3 can be designed in various manners.

Figure 4:
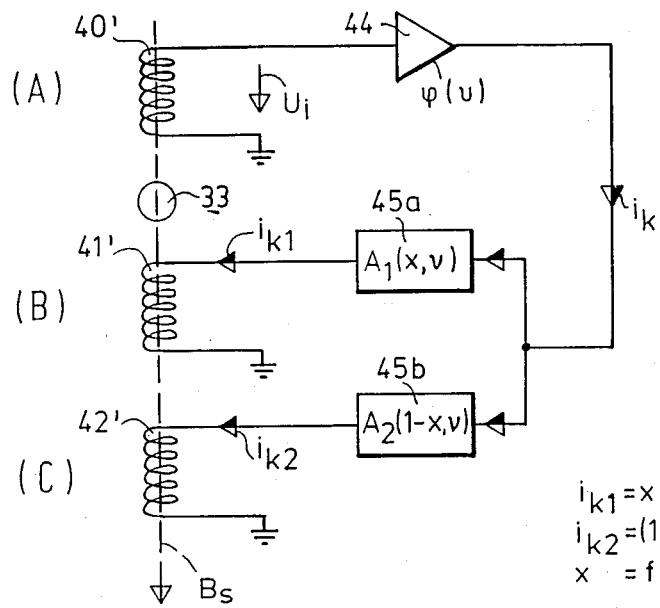
FIG. 4 shows a circuit diagram to illustrate a variant of a circuit of the system according to FIG. 3.

FIG. 4 shows a first variant, in which coils 40, 41 and 42 are each denoted by a prime. First coil 40 serves as induction coil 40' and provides an induction voltage U$i$, which is supplied to n amplifier 44. Amplifier 44 produces a compensating current $i_k$, which is advanced to two acattenuators 45a and 45b. This divides current $i_k$ in accordance with the following ratios:

$i_{k1} = x i_k$ or $i_{k2} = (1-x) i_k$

Current component $i_{k1}$ flows through second coil 41', which is disposed as a first compensating coil, while second current component $i_{k2}$ flows through coil 42', which is disposed as a second compensating coil.

Elements 45a and 45b can also be implemented in the form of amplifiers. They can have an adjustable frequency response f($v$), so that the division of the current, i.e. parameter x, is a function of frequency and can thus be optimized on the basis of frequency. In principle, one of attenuators 45a, 45b can be eliminated. In the simplest case, attenuators 45a, 45b can be implemented in the form of potentiometers. However, due to the adjustable frequency characteristic, operational amplifiers are especially advantageous. Since the ratio between $i_{k1}$ and $i_{k2}$ is the significant aspect, modifications are also conceivable in which the total of $i_{k1}$ and $i_{k2}$ is unequal to $i_k$.

Like specimen area 33, all coils 40', 41' and 42' are permeated by interference induction $B_s$.

In order to position, dimension and excite coils 40', 41' and 42', the following concept is utilized, in which coils 40', 41' and 42' are each characterized by the index A, B and C.

If induced voltage $U_i$ is now examined, it can be seen that it consists of components that are produced by an interference flux $\phi_s$, as well as by current components $i_{k1}$ and $i_{k2}$, taking into consideration the respective back inductivities $L_{BA}$ and $L_{CA}$. The following results:

$$U_i = d\phi_s/dt + L_{BA} di_{k1}/dt + L_{CA} di_{k2}/dt \quad (1)$$

or $$\phi_s + L_{BA} i_{k1} + L_{CA} i_{k2} = 0 \quad (2)$$

Substituting the above-indicated ratio (2) for the current components and the ratio between magnetic flux and induction produces:

$$w_A A_A B_s + (x L_{BA} + (1-x) L_{CA}) i_k = 0 \quad (3)$$

where $w_A$ is the number of turns and $A_A$ is the surface area of coil 40'. Solving (3) for $i_k$ produces:

$$i_k = \frac{-w_A A_A B_s}{x L_{BA} + (1-x) L_{CA}} \quad (4)$$

In addition to the condition that induced voltage $U_i$ in induction coil 40' should become zero, the total magnetic induction at the specimen location should also become zero. This total magnetic induction $B_{tot}$ consists of the following components:

$$B_{tot} = B_s + B_A + B_B = 0 \quad (5)$$

Dividing (5) by $B_s$ produces:

$$B_{tot}/B_s = 1 + B_A/B_s + B_B/B_s = 0 \quad (6)$$

Depending upon the coil configuration and coil dimensions that have been selected, the induction that is present in a coil can now be expressed as a ratio of k, into which diameter d, length l, number of turns w and current component x are entered. In the case of the induction that is produced in coils 41' and 42', the following thus applies:

$$B_A = K_A(d, l, w, x) x i_k \quad (7)$$

$$B_B = K_B(d, l, w, x) (1-x) i_k \quad (8)$$

Entering (4), (7) and (8) in (6), finally, produces:

$$B_{tot}/B_s = 1 - K_A'(d,l,w,x) - K_B'(d,l,w,x) = 0 \quad (9)$$

(9) represents an equation in which all intermediate parameters, including the back inductivities, are replaced by terms for dimensions, number of turns and current components. In the case of an asymmetrical configuration similar to that shown in FIG. 3, there will also be terms with the positions of the asymmetrically arranged coils.

The next step is to assume the special case in which x=0 or x=1, i.e. the case in which only one of compensating coils 41' or 42' is effective and receives entire compensating current $i_k$, and to optimize the free parameters for a given basic configuration, e.g. the widths, lengths or number of turns of the coils, in such a manner as to satisfy (9).

If, for example, a symmetrical configuration is assumed, as will be briefly discussed below in connection with FIG. 6, in which coil 42' is left out of consideration and only coils 40' and 41' are taken into consideration, and, in addition, if it is further assumed that these two coils are concentrically arranged, with specimen area 33 being surrounded thereby and located in the center thereof, it is possible to demonstrate that, assuming identical axial length of coils 40' and 41', equation (9) will be satisfied if the diameter-to-length ratio of coils 40' and 41' is exactly equal to $\sqrt{3/2}$, i.e. is approx. 0.87. This means that in a configuration in which coil 42' remains de-energized, complete compensation will ideally be made for interference induction $B_s$ in specimen area 33, with induced voltage $U_i$ simultaneously becoming zero.

However this applies only with respect to ideal conditions; consequently, the theoretically calculated success will not be obtained, for example, if coils 40', 41' —as is unavoidable due to reasons of space—couple with the superconductive magnet coil of the cryostat. In this case, the persistently energized superconductive coil serves as a screen, which means that the above-indicated theoretical observation will no longer be applicable.

In order to compensate for this systematic error, the present invention proposes that second compensating coil 42' also be energized and that compensating current $i_k$ be divided between coils 41' and 42' In this manner, complete compensation will be made for interference induction $B_s$, even in the presence of interfering internals, as has been described.

Figure 5:
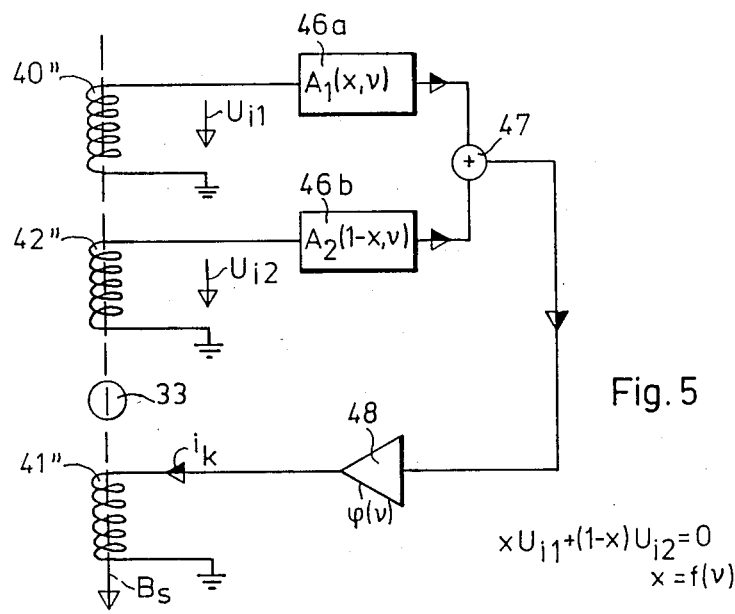
FIG. 5 shows an alternative version, according to the present invention, of the circuit diagram illustrated in FIG. 4.

A circuit that is equivalent to that shown in FIG. 4 is illustrated in FIG. 5, in which coils 40, 41, 42 according to FIG. 3 are employed in the manner suggested in FIG. 5 through notation by a double prime. In this case, coils 40" and 42" are employed as two induction coils, while coil 41" serves as the sole compensating coil. The signal voltages from induction coils 40" and 42" are advanced via two attenuators 46a, 46b to a voltage adder 47, with the shift factor again being x. The sum of the two tapped voltages is supplied to an amplifier 48, which produces compensating current $i_k$ therefrom.

The attenuators can have an adjustable frequency response f(v). In principle, one attenuator can be eliminated. In the simplest case, the attenuation or amplification of the voltage can be achieved by means of potentiometer circuitry.

A concept of the type that has already been described in detail above can be derived with the arrangement according to FIG. 5, and the results are correspondingly applicable.

Figure 6:
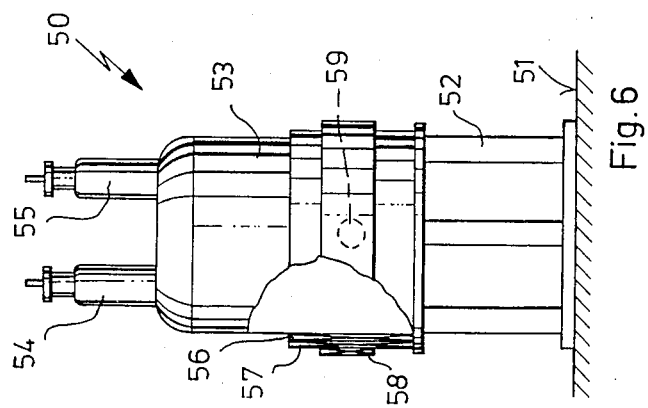
FIG. 6 shows a representation of a first practical example of a superconductive magnet system according to the present invention.

As already briefly suggested above, FIG. 6 shows a first practical example of a superconductive magnet system 50, which is located on a floor 51 of an experimentation room. Located on a frame 52 above floor 51 is a cryostat 53, having connections 54, 55 for liquid helium and liquid nitrogen.

Wound on the cuter jacket of cryostat 53 are an induction coil 56 and, closely adjacent thereto, a first compensating coil 57 of identical axial length; wound on first compensating coil 57 is a second compensating coil 58 of shorter axial length, however symmetrically arranged thereto. Coil arrangement 56/57/58 surrounds a specimen area 59 in the symmetrical center thereof.

As has already been explained above in connection with the theoretical derivation of the required ratios in conjunction with FIG. 4, induction coil 56 and first compensating coil 57, in themselves, would theoretically be sufficient to provide complete compensation for the field interference in specimen area 59 if coils 56/57 are dimensioned and arranged in the above-indicated manner. Second compensating coil 58, on the contrary, is employed to compensate for the real effects that are caused by the presence of cryostat 53 and the superconductive magnet coil that is arranged therein.

FIG. 7 shows a further practical example of a superconductive magnet system 60, having a first induction coil 61, which is wound about the cryostat approximately half-way up. A second induction coil 62, as well as a compensating coil 63, are located on a floor 64 beneath the cryostat. All coils 61, 62, 63 are arranged concentrically relative to the vertical axis 65 of superconductive magnet system 60.

In the practical example according to FIG. 7, circuitry is employed that is similar to that shown in FIG. 5, in which induction coils 61, 62 are disposed in series between a ground 69 and—via a series resistor 70—an intergrating amplifier. The opposite voltage addition is set by means of a potentiometer 72.

73 suggests a remote interference, which could be produced by an elevator or a streetcar, for example. Remote interference 73 permeates entire superconductive magnet 60, as well as induction coils 61 and 62, with induction coil 62 assuming the entire remote interference, while induction coil 61 assumes only a portion thereof from superconductive magnet 60 through the couplings. Through the compensating field that is produced in very large compensating coil 63 which is arranged on floor 64, a compensating field is produced whose nature is highly similar to that of a remote interference.

FIGS. 8 through 11 show measurements that were performed with an arrangement which is similar to that illustrated in FIG. 7, with each sub-figure (a) showing a nuclear resonance line that has been subjected to interference and each sub-figure (b) showing a measurement that has been compensated by the apparatus according to the present invention.

FIG. 8 shows a case in which remote interference 73, which was, however, produced in a defined manner for the measurements in FIGS. 8 through 11, had a frequency of 0.2 Hz with an intensity of approx. 40 mG. It can be seen that, in addition to the nuclear resonance line 80, a small sideband 81 had also formed, which was totally lacking in the measurement shown in FIG. 8b, which was compensated in accordance with the present invention.

A similar situation, however much more pronounced, can be seen from the representations that are shown in FIGS. 9a and 9b, where remote interference 73 had a frequency of 0.5 Hz with the same intensity. In this interference situation, as well, it was possible to eliminate this interference entirely by means of the present invention.

The representation that is illustrated in FIG. 10a shows the effect of an interference frequency of 1.0 Hz with the same interference amplitude. It has already been mentioned above that superconductive magnet coils of the type that are pertinent here can have a pronounced inherent resonance in the frequency range of around 1.0 Hz, which means that a remote interference 73 which has this frequency has a particularly unpleasant effect, as can clearly be seen from FIG. 10a, as inherent resonances were excited in the superconductive magnet coil. As shown by FIG. 10b, however, it is possible to largely compensate for the interference in this case, also.

Figure 11:
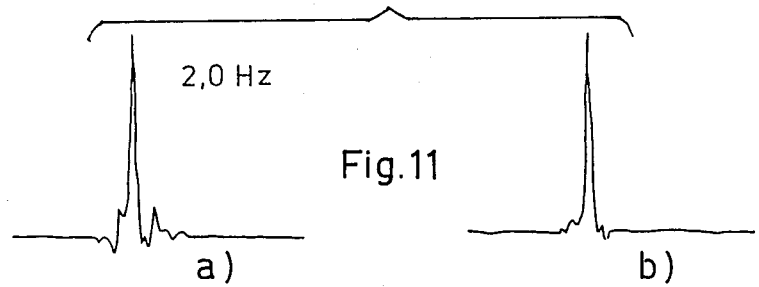

FIG. 11 shows an interference having a frequency of 2.0 Hz, and it can be seen that this interference, too, can largely be compensated for through the employment of an apparatus according to the present invention.

The present invention has been described above on the basis of preferred practical examples thereof. Obviously, many modifications and variations of the present invention are possible in the light of the above teachings. It should therefore be understood that, within the scope of the appended claims, the present invention may be practiced otherwise than as specifically described. In particular, individual characteristics of the invention can be employed individually or in combination one with the other.

This applies, in particular, with respect to the numerous applications of the apparatus according to the present invention that are possible in a variety of measurement instrumentation in which a magnetic field is required, such as NMR spectroscopy and tomography, mass spectrometers, etc., as well as with respect to the virtually unlimited range of variations that are possible through the combination of various induction and compensating coils within and outside the magnet system, in the proximity thereof, or at an axial or radial distance therefrom.

What is claimed is:

1. In a magnet system including a superconducting field coil for producing a magnetic field having an axis and along its axis a specimen area of high homogeneity, compensating means for compensating for time-variant field interference in said magnetic field, said compensating means comprising:
    at least one sensing coil arranged coaxially with respect to said field coil and having a diameter which is greater than the diameter of said field coil,
    at least two compensating coils, each being arranged coaxially with respect to said field coil and having a diameter which is greater than the diameter of said field coil, said at least two compensating coils forming a compensating coil arrangement which is axially asymmetrical relative to said specimen area,
    a control unit connected to said at least one sensing coil and to said compensating coil arrangement for driving an electrical compensating current through said compensating coil arrangement in response to the voltage induced in said at least one sensing coil when variations of the magnetic field permeating said at least one sensing coil occur, said control unit including an electrical current divider for dividing said compensating current into at least two weighted portions, each portion being fed to one of said at least two compensating coils, and
    said at least one sensing coil, said control unit and said compensating coil arrangement forming a closed-loop control arranged for compensating for any variation of the magnetic field permeating said at least one sensing coil by the magnetic field produced by the compensating current fed to said compensating coil arrangement.

2. In a magnet system including a superconducting field coil for producing a magnetic field having an axis and along its axis a specimen area of high homogeneity, compensating means for compensating for time-variant field interference in said magnetic field, said compensating means comprising:
    at least two sensing coils, each being arranged coaxially with respect to said field coil and having a diameter which is greater than the diameter of said field coil, said at least two sensing coils forming a sensing coil arrangement which is axially asymmetrical relative to said specimen area,
    at least one compensating coil arranged coaxially with respect to said field coil and having a diameter which is greater than the diameter of said field coil,
    a control unit connected to said sensing coil arrangement and to said at least one compensating coil for driving an elecrtrical compensating current through said at least one compensating coil in response to the voltages induced in each of said at least two sensing coils when variations of the magnetic field permeating said sensing coil arrangement occur, said control unit including a voltage adder for combining said voltages with a given weight to produce an output signal for controlling the said compensating current, and
    said sensing coil arrangement, said control unit and said at least one compensating coil forming a closed-loop control arranged for compensating for any variation of the magnetic field permeating said sensing coil arrangement by the magnetic field produced by the compensating current fed to said at least one compensating coil.

3. The apparatus according to claim 1, wherein said compensating coil arrangement is arranged at an axial distance from said field coil of said magnet system and has a diameter that is significantly greater than, and preferably at least twice as large as, the diameter of said field coil.

4. The apparatus according to claim 2, wherein said magnet system is arranged with a vertical axis in a frame above a floor, and wherein said compensating coil arrangement is arranged on said floor, beneath said frame.

5. The apparatus according to claim 1, wherein said magnet system includes the magnet of a nuclear resonance spectrometer having a control circuit with which the spectral position of a given line of a reference sample is monitored and a compensating field is produced by means of a coil as a function of a shift of said line, and wherein said coil simultaneously serves as one of said compensating coils.

6. The apparatus according to claim 1, wherein said magnet system includes the magnet of a mass spectrometer.

7. The apparatus according to claim 1, wherein said control unit operates in a frequency range of approximately 0.05 to 5 Hz.

8. The apparatus according to claim 1, wherein said control unit has a frequency response that can be set on the basis of amplitude and phase.

9. The apparatus according to claim 1, wherein the amplitude and phase response of said control unit can be set as a function of frequency.

10. The apparatus according to claim 2, wherein said at least one compensating coil is arranged at an axial distance from said field coil of said magnet system and has a diameter that is significantly greater than, and preferably at least twice as large as, the diameter of said field coil.

11. The apparatus according to claim 10, wherein said magnet system is arranged with a vertical axis in a frame above a floor, and wherein said at least one compensating coil is arranged on said floor, beneath said frame.

12. The apparatus according to claim 2, wherein said magnet system includes the magnet of a nuclear resonance spectrometer having a control circuit with which the spectral position of a given line of a reference sample is monitored and a compensating field is produced by means of a coil as a function of a shift of said line, and wherein said coil simultaneously serves as said at least one compensating coil.

13. The apparatus according to claim 2, wherein said magnet system includes the magnet of a mass spectrometer.

14. The apparatus according to claim 2, wherein said control unit operates in a frequency range of approximately 0.05 to 5 Hz.

15. The apparatus according to claim 2, wherein said control unit has a frequency response that can be set on the basis of amplitude and phase.

16. The apparatus according to claim 2, wherein the amplitude and phase response of said control unit can be set as a function of frequency.

* * * * *

UNITED STATES PATENT AND TRADEMARK OFFICE
CERTIFICATE OF CORRECTION

PATENT NO. : 4,788,502
DATED : November 29, 1988
INVENTOR(S) : Anton W. Keller, Werner H. Tschopp and Anton Kuster It is certified that error appears in the above-identified patent and that said Letters Patent is hereby corrected as shown below:

Title page, after "Inventors", insert Assignee:

Spectrospin AG
Zurich, Switzerland

Signed and Sealed this

Twelfth Day of September, 1989

Attest:

DONALD J. QUIGG

Attesting Officer

Commissioner of Patents and Trademarks